United States Patent [19]

Saigo et al.

[11] Patent Number: 4,929,903
[45] Date of Patent: May 29, 1990

[54] METHOD OF AND APPARATUS FOR ASSESSING INSULATION CONDITIONS

[75] Inventors: Akira Saigo, Chiba; Shigenari Maezawa, Kashiwa; Tomoaki Kageyama, Kuga; Keizaburo Ishikura, Kuga; Akio Sera, Kuga; Junji Suehiro, Otake, all of Japan

[73] Assignee: Mitsui Petrochemical Industries, Ltd., Tokyo, Japan

[21] Appl. No.: 228,578

[22] Filed: Aug. 5, 1988

[30] Foreign Application Priority Data

Aug. 7, 1987 [JP] Japan .................................. 62-197812
Feb. 17, 1988 [JP] Japan .................................. 63-34800
Feb. 26, 1988 [JP] Japan .................................. 63-43529
Feb. 29, 1988 [JP] Japan .................................. 63-47213

[51] Int. Cl.$^5$ ............................................ G01R 31/02
[52] U.S. Cl. .................... 324/544; 324/521; 324/522; 324/529; 324/536; 324/541; 324/551
[58] Field of Search ............... 324/544, 541, 557, 551, 324/559, 536, 529, 509, 522, 521, 552, 553, 510, 500; 333/177, 25, 32; 336/73, 173, 174; 340/650

[56] References Cited

U.S. PATENT DOCUMENTS

| | | | |
|---|---|---|---|
| 3,739,272 | 6/1973 | McKean | 333/177 X |
| 3,775,676 | 11/1973 | Harrold et al. | 324/541 X |
| 4,064,454 | 12/1977 | Yoshino et al. | 324/547 |
| 4,112,354 | 9/1978 | Bahder et al. | 324/544 |
| 4,287,545 | 9/1981 | Mayer | 336/174 X |
| 4,371,832 | 2/1983 | Wilson et al. | 324/509 |
| 4,546,309 | 10/1985 | Kang et al. | 324/529 |
| 4,779,051 | 10/1988 | Grünewald et al. | 324/536 |
| 4,797,805 | 1/1989 | Nimmersjo | 324/509 X |

Primary Examiner—Reinhard J. Eisenzopf
Assistant Examiner—Robert W. Mueller
Attorney, Agent, or Firm—Sherman and Shalloway

[57] ABSTRACT

A method of and apparatus for the detection of insulation deterioration in an electrical power supply system utilizes the detection of a progressive wave generated by a corona discharge or partial discharge due to such insulation deterioration. Sensing of said progressive wave may be effected by an apparatus comprising: a first coil having two primary windings, wound with the same number of turns and in the same direction, and a secondary winding, the primary and secondary windings being wound on a core whose magnetomotive force and magnetic flux density are roughly proportional to each other; a second coil composed of a primary winding and a secondary winding both wound on a core whose magnetomotive force and magnetic flux density are roughly proportional to each other; and an impedance circuit. Determination of the position of insulation deterioration may be effected by comparing the phase of the progressive wave at a reference point in a common bus with the phase of the progressive wave in each of the power supply lines branching off from the common bus.

8 Claims, 9 Drawing Sheets

METHOD OF AND APPARATUS FOR ASSESSING INSULATION CONDITIONS

BACKGROUND OF THE INVENTION

This invention relates to a method of and an apparatus for assessing the insulation condition in electrical equipment, cables, etc. The present invention is to be utilized for detecting any deterioration in insulation in electrical equipment and cables by detecting the corona discharge or the partial discharge generated when such a deterioration occurs.

Generally, various factors can locally cause a poor insulation in an underground cable and the electrical equipment connected thereto.

At least 80 percent of serious accidents in such cables and their equipment are attributable to such a deterioration in insulation which can be caused by external mechanical forces, chemical changes in the insulators, tree-branch-like deterioration of the insulator known as "water tree", etc. In view of this, various methods of assessing insulation conditions have been proposed.

According to one of these methods, a power supply system is periodically tested for the insulation condition thereof by temporarily stopping the power supply. In this method, the test may be conducted, for example, by applying DC voltage to the power line. What is to be measured to assess the insulating performance of the system is: Firstly, partial discharge; secondly, residual voltage, discharge current or residual charge, which shows reduction in dielectric strength; or potential damping and leakage current.

On the other hand, there is a method of assessing the insulating performance of a power line by applying AC voltage to the power line concerned. What is to be measured is: partial discharge; or dielectric relaxation which can be assessed through dielectric tangent.

Apart from this, there is a method wherein a power supply system is examined in a hot-line condition using a portable measuring apparatus.

In the above-described method of assessing the insulataing performance of a power supply system by periodically stopping the power supply, the power lines forming the system have to be examined one by one, so that it takes a lot of time to conduct the measurement. Further, there is a limitation in the number of places that can be measured during a single stopping of power supply, so that if the insulation of some part has gradually deteriorated, there is no knowing the trend thereof. Accordingly, no preventive measures can be taken against a deterioration of this type.

On the other hand, the problem with the method in which a power supply system is examined in a hot-line condition using a portable measuring apparatus is that only a skilled engineer can perform the measurement because of the difficulty in securing the operational safety, to say nothing of the labor intensiveness in the preparatory operations and the measurement.

SUMMARY OF THE INVENTION

Accordingly, it is an object of this invention to provide a method of and an apparatus for examining the insulation condition of electric equipment and power cables enabling the insulation condition thereof to be continuously monitored in a hot-line condition. According to this invention, judgment is made as to whether a deterioration signal generated by any deterioration in the insulation of equipment or cables is superimposed on the current flowing through the object of measurement.

In accordance with this invention, there is first provided an apparatus for detecting deterioration in insulation by discriminating the signal current components indicative of the deterioration in insulation out of a current flowing through the object of measurement which is composed of a plurality of superimposed current components: the charging current component in the insulator; the dominant wave of a leakage current as well as the higher harmonic thereof; and those current components which indicate any deterioration of the insulator, i.e. a high-frequency corona discharge current, a partial discharge current, a kick-like pulse current, etc.

This apparatus comprises:

a first coil 1 composed of two primary windings 11, 12 and a secondary winding 13 wound on a core whose magnetomotive force and magnetic flux density are proportional to each other, said primary windings 11 and 12 being wound with the same number of turns and in the same direction, a second coil 2 composed of a primary winding 21 and a secondary winding 22 wound on a core whose magnetomotive force and magnetic flux density are approximately proportional to each other, and an impedance circuit 3, the terminals 21-$a$ and 21-$b$ of the primary winding 21 in the second coil 2 being respectively connected to the winding end terminal 11-$b$ of the primary winding 11 and the winding end terminal 12-$b$ of the primary winding 12 in the first coil 1, said impedance circuit 3 being connected to the winding end terminal 11-$b$ of the primary winding 11 and the winding start terminal 12-$a$ of the primary winding 12 in the first coil 1, a signal indicative of deterioration in insulation of electrical equipment or power cables being obtained at the terminals 13-$a$ and 13-$b$ of the secondary winding 13 in the first coil 1 or at the terminals 22-$a$ and 22$b$ of the secondary winding 22 in the second coil 2 when the winding start terminal 11-$a$ of the primary winding 11 and the winding start terminal 12-$a$ of the primary winding 12 in the first coil 1 are connected to the shielding case of said electric apparatus or the shield of said power cable and to the ground, respectively.

In accordance with this invention, there is further provided a method of ascertaining the power line in a power supply system with two or more power lines whose insulating performance has deteriorated by detecting the progressive wave generated by the corona discharge or the partial discharge in the section concerned.

Furthermore, there is provided an apparatus for assessing the insulating condition of a power supply system with two or more power lines, comprising sensors S adapted to detect the progressive wave generated by the corona discharge or the partial discharge in the section concerned when the insulating performance of a power line composing said power supply system has deteriorated, and a measurement section 53 adapted to receive the output from said sensors S and to measure the magnitude threof, each of said sensors S being composed of a first winding M1 with short-circuited ends and a second winding M2, said first and second windings M1 and M2 being wound on a core K whose magnetomotive force and magnetic flux density are roughly proportional to each other, i.e., whose BH characteristic curve is approximately linear and whose magnetic permeability is approximately constant from the low frequency region to the high frequency region.

BRIEF DESCRIPTION OF THE DRAWINGS

FIG. 5-1 is a schematic view showing the construction as applied to a DC high-tension test or an AC withstand voltage test;

FIG. 5-2 is a schematic view similar to FIG. 5-1 differing therefrom in that the apparatus in accordance with this invention is installed on the high-tension side.

DESCRIPTION OF THE PREFERRED EMBODIMENTS

Preferred embodiments of this invention will now be specifically described with reference to the attached drawings.

Figure 1:
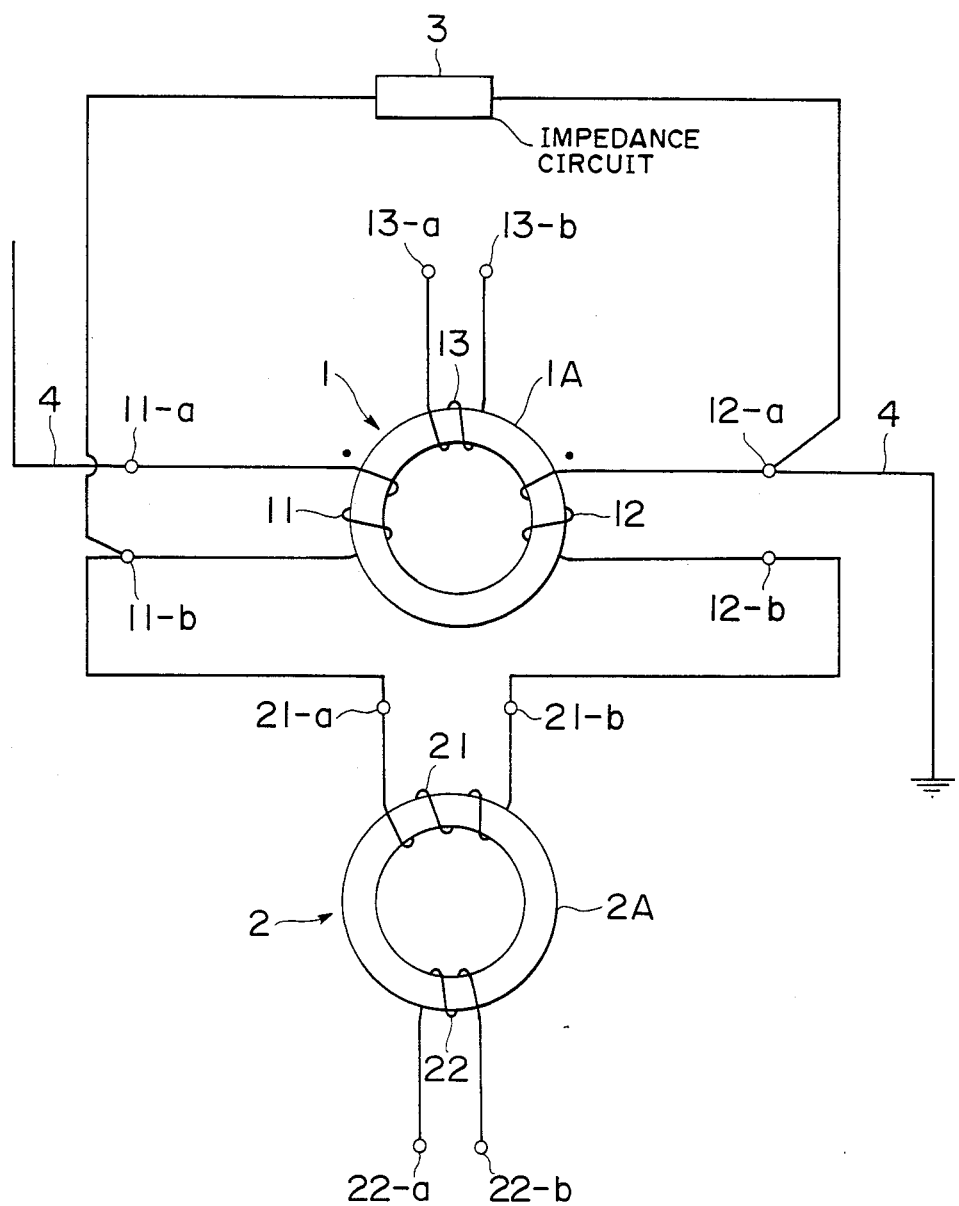
FIG. 1 is a schematic view illustrating the principle of an apparatus in accordance with a first embodiment of this invention.

FIGS. 1 through 5-2 show an apparatus for detecting any deterioration in insulation of electric equipment and cables in accordance with the first embodiment of this invention. The principle of this embodiment is shown in FIG. 1.

This apparatus includes coils 1 and 2 which are equipped with cores 1A and 2A, respectively. These cores have a high magnetic permeability which is approximately over the entire frequency range from low to high regions. Their residual magnetism and coercive force are both small, and their magnetic characteristic is such as can be represented by a linear BH-curve.

The apparatus further includes an impedance circuit 3 composed of capacitors, resistors, reactors, semiconductor elements, etc., arranged individually or in combination.

A principal circuit designed to pass the current containing the deterioration signals is shown at 4.

The coil 1 includes primary windings 11 and 12 wound on the core 1A with the same number of turns and in the same direction.

The coil 1 further includes a secondary winding 13.

The coil 2 includes a primary winding 21 and a secondary winding 22.

The primary winding 11 of the coil 1 includes a winding start terminal 11-$a$ and a winding end terminal 11-$b$.

The primary winding 12 of the coil 1 includes a winding start terminal 12-$a$ and a winding end terminal 12-$b$.

The primary winding 21 of the coil 2 includes terminals 21-$a$ and 21-$b$.

The secondary winding 22 of the coil 2 includes terminals 22-$a$ and 22-$b$.

The terminals 11-$b$ and 12-$b$ are connected to the terminals 21-$a$ and 21-$b$, respectively, by means of a wiring, and the impedance circuit 3 is connected to the terminals 11-$b$ and 12-$a$.

The terminals 11-$a$ and 12-$a$ are connected to the principal circuit 4, so that the current to be tested which includes the signals of insulating deterioration may be passed through the principal circuit.

The output of the signals of insulating deterioration can be obtained at the terminals 13-$a$ and 13-$b$ of the secondary winding 13 of the coil 1 as well as at the terminals 22-$a$ and 22-$b$ of the secondary winding of the coil 2. Either or both of the terminal pairs may be utilized according to the testing purpose.

When a composite current composed of plurality of superimposed current components: a charging current component of the insulator; the dominant wave of a leakage current as well as the higher harmonic thereof; and those current components which indicate deterioration of the insulator, i.e. a high-frequency corona discharge current, a partial discharge current, a kick-like pulse current, etc. is passed through the principal circuit 4, the entire current of the principal circuit flows through the primary winding 11 of the coil 1. On the other hand, a current corresponding to the vector difference between the entire current and the current which has flowed through the impedance circuit 3 flows through the primary winding 12 of the coil 1. This current flows in series through the primary winding 21 of the coil 2.

The magnetomotive force of the core 1A corresponds to the vector composition of the magnetomotive force generated by the current in the primary winding 11 and that generated by the current in the primary winding 12. Since the windings 11 and 12 are wound in the same direction and the current directions in the winding 11 and 12 are opposed to each other with respect to the start and end of the windings, the magnetomotive force of the core 1A corresponds to the vector difference between the magnetomotive force generated by the primary winding 11 and that due to the primary winding 12. The change in the magnetomotive force of the core 1A generates a voltage in the secondary winding 13 of the coil 1.

The magnetomotive force of the core 2A is due to a current which corresponds to the vector difference between the entire current in the principal circuit and the current which flows through the impedance circuit 3, the change in the magnetomotive force generating a voltage in the secondary winding 22 of the coil 2.

Accordingly, it is possible to obtain the element of the signal of insulating deterioration consisting of a high-frequency signal or a pulse-like signal superimposed on the principal circuit current out of the secondary winding 13 of the coil 1 or the secondary winding 22 of the coil 2 in the form of a discriminated voltage signal by appropriately selecting the magnetic circuit in terms of the size and configuration of the cores 1A and 2A, the number of turns of the coils, etc., the impedance type or the characteristic constant of the impedance circuit 3, etc.

An embodiment of the first type of the apparatus in accordance with this invention will now be specifically described.

Figure 2:
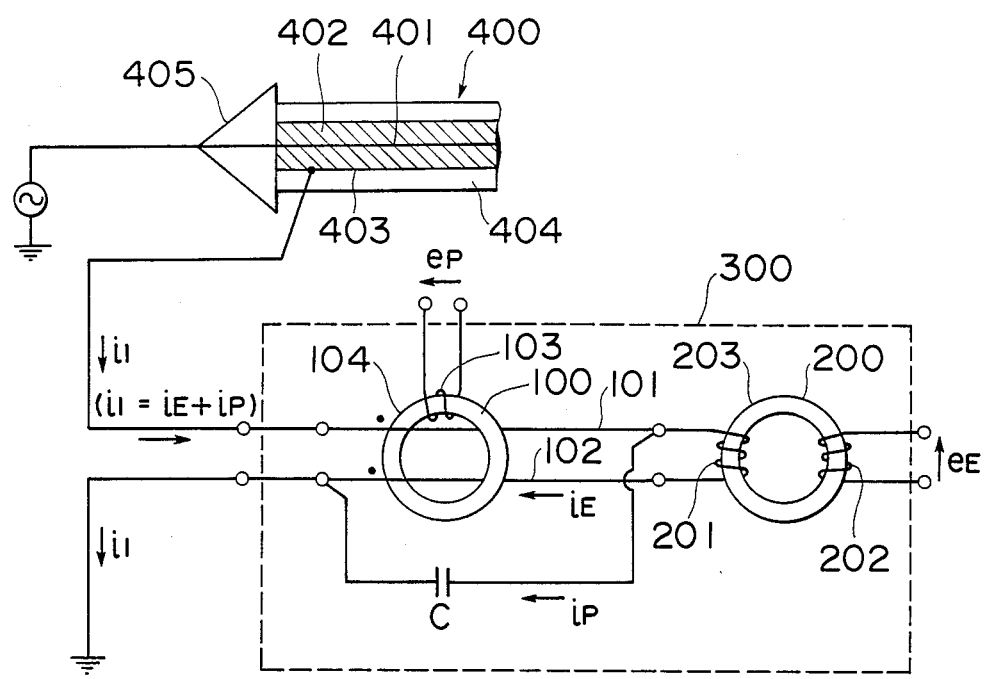
FIG. 2 is a schematic view showing an apparatus in accordance with the first embodiment of this invention.

FIG. 2 shows the construction of an embodiment of the apparatus for detecting deterioration in insulation of electric equipment and cables in accordance with this invention as applied to a high-tension cable which is in a hot-line condition. This apparatus includes cores 100 and 200 made of a cobalt based amorphous alloy having a high magnetic permeability which is approximately constant over the entire frequency range from low to high regions as well as a flat hysteresis characteristic. As an example of such a material, the VATROVAC-6025F manufactured by Vacuumschmelze GmbH may be mentioned here. Primary windings 101 and 102 are passed through the core 100 by one turn in the same direction. Further, a secondary winding 103 for detecting signals is wound on the core 100 to form a coil 104. A primary winding 201 and a secondary winding 202 are wound on the core 200 to form a coil 203. A capacitor element forming the impedance circuit is shown at C, and a magnetic shielding box adapted to prevent intrusion of noise signals from outside at 300. A power cable 400, which is the object to be tested, is composed of a conductor 401, an insulator 402 covering the conductor, a shield 403 covering the insulator, and a sheath insulator 404 covering the shield. In this case, the principal circuit current $i_1$ which is necessary for performing the measurement is taken out of the shield 403. The test is conducted while measuring the voltage to ground at a cable head 405.

Suppose the principal circuit current $i_1$ is a composite current composed of the charging current in the insulator, the dominant wave of the leakage current as well as a low-frequency current $i_E$ which is the higher harmonic thereof, and signals of insulation deterioration such as the corona discharge current, the partial discharge current, and a high-frequency current $i_P$ which is a kick-like pulse current, the principal circuit current $i_1$ flows through the primary winding 101 of the coils 104. The primary winding 201 of the coil 203 has a high inductive reactance to a high frequency current and a low inductive reactance to a low frequency current. The capacitor C has a low capacitive reactance to a high frequency current and a high capacitive reactance to a low frequency current. As a result, the high frequency current $i_P$ flows through the capacitor C, and the low frequency current $i_E$ flows through the primary winding 102 of the coil 104 by way of the primary winding 201 of the coil 203.

Accordingly, the element of the magnetomotive force of the core 100 which is due to the low frequency current $i_E$ is cancelled, leaving only the element which is due to the high frequency current $i_P$. As a result, the signal voltage $e_P$ due to the high frequency current $i_P$ can be obtained from the secondary winding 103 of the coil 104.

Similarly, the signal voltage $e_E$ due to the low frequency current $i_E$ can be obtained from the secondary winding 202 of the coil 203.

Figure 3:
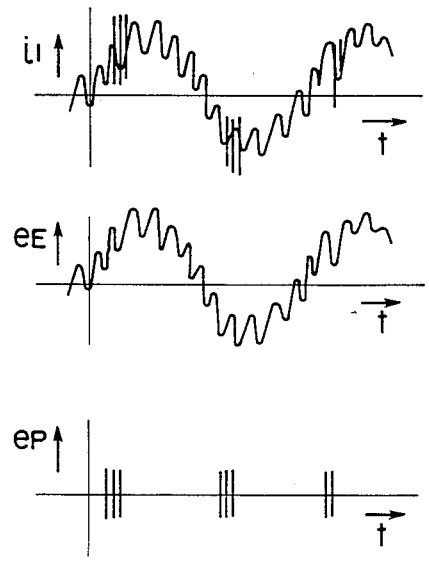
FIG. 3 is a schematic diagram showing the relation between principal circuit current $i_1$, a detection signal voltage $e_E$ due to a low frequency current $i_E$ and a detection signal voltage $e_P$ due to a high-frequency current $i_P$.

FIG. 3 shows the relation between the principal circuit current $i_1$, the detecting signal voltage $e_E$ due to the low frequency current $i_E$, the detecting signal voltage $e_P$ due to the high frequency current $i_P$ in terms of the change with time.

Figure 4:
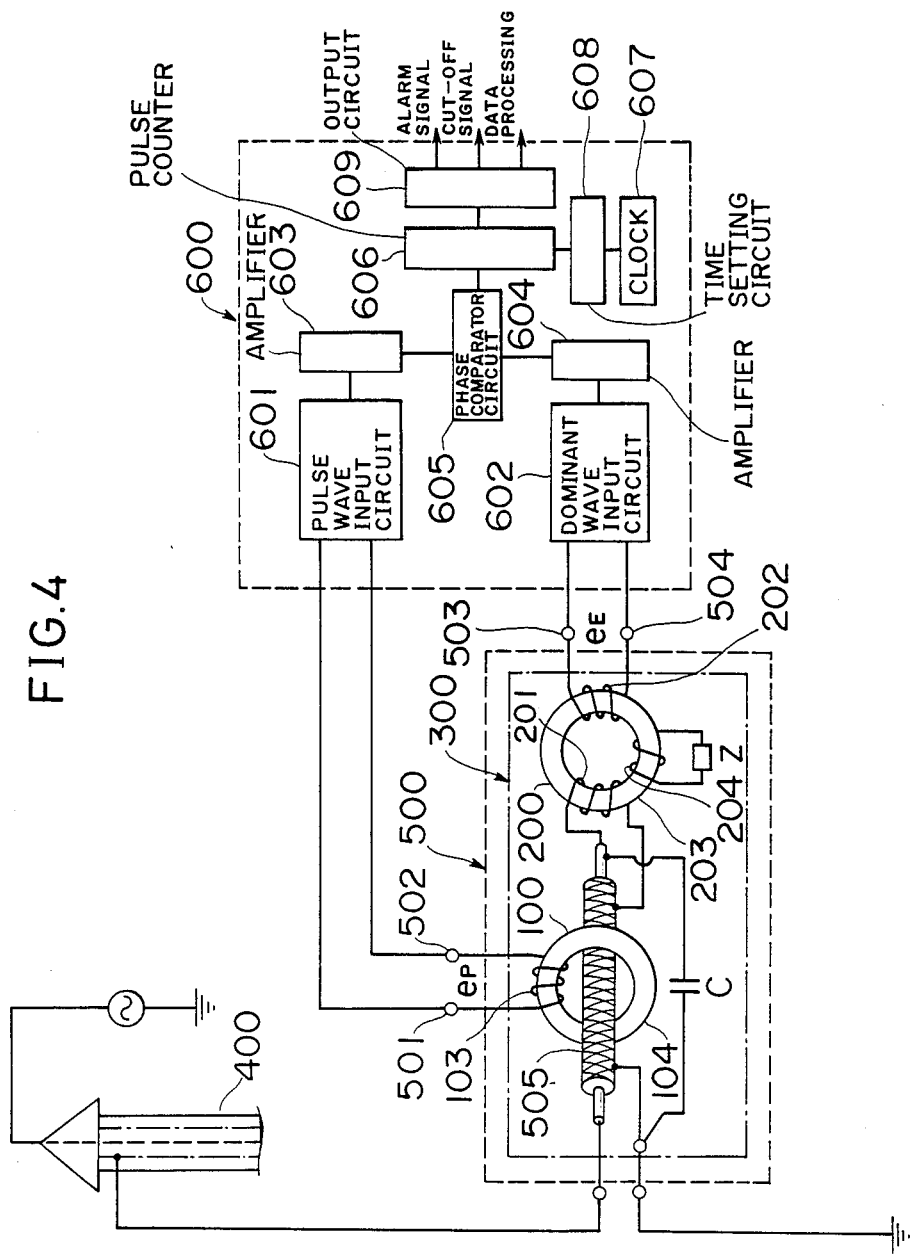
FIG. 4 is a block diagram showing the construction of this invention shown in FIG. 2 as applied to an apparatus for continuously monitoring the insulation condition of a high-tension cable.

FIG. 4 shows the apparatus illustrated in FIG. 2 as applied to an apparatus for continuously monitoring the insulation condition of a high-tension cable. This figure shows a detecting section 500 adapted to detect any deterioration in insulation of the cable concerned. This detection section 500 includes terminals 501 and 502 for obtaining the signal voltage $e_P$ generated by the high frequency current $i_P$ and terminals 503 and 504 for obtaining the signal voltage $e_E$ due to the low frequency current $i_E$ (the $i_P$ and $i_E$ are the same as those in the embodiment shown in FIG. 2). In FIG. 4, the primary windings 101 and 102 are replaced by a coaxial cable 505. An impedance circuit which is shown at Z serves to prevent any magnetic saturation of the core when the low frequency current such as the charging current is increased. This impedance circuit Z is connected to a tertiary winding 204 wound on the core 200. A signal receiver is shown at 600. This signal receiver 600 is composed of a pulse wave input circuit 601, a dominant wave input circuit 602, amplifiers 603, 604, a phase comparator 605, a pulse counter 606, a timing circuit 607, a time setting circuit 608, and an output circuit 609.

When the insulating performance of the insulator 402 of the power cable 400 has deteriorated on account of a water-tree or an electrical-tree phenomenon or a scratch on the insulator of the cable etc., a signal indicative of deterioration in insulation which consists of a corona discharge current, a partial discharge current, or a kick-like discharge current is superimposed on the charging current of the insulator 402 by the voltage to ground of the usually supplied voltage, and is allowed to flow through to the ground through the shield 403. The detecting section 500 serves to discriminate the signal element consisting of a signal of insulating deterioration current from that consisting of the charging current by the pulse wave input circuit 601 and the dominant wave input circuit 602 and to input the signal elements thus discriminated to the signal receiver 600.

The output of the pulse wave input circuit 601 and that of the dominant wave input circuit 602 are amplified by the amplifiers 603 and 604, respectively, and applied to the phase comparator 605 where examination is conducted for the existence of the pulse wave of a signal of insulating deterioration with respect to the phases of the charging current, i.e. the dominant wave; the result is counted by the pulse counter circuit 606. The pulse counter circuit 606 serves to count the deterioration signal pulses generated during a predetermined period of time which is set by counting with the time setting circuit 608 of the reference timing generated by the timing circuit 607. When the counting has exceeded a predetermined value, an ouput signal for the output circuit 609 is generated.

This causes the output circuit 609 to issue an alarm indicating detection of a deterioration signal. The output circuit 609 also transmits a cut-off signal to a circuit breaker (not shown) for separating, if necessary, the deteriorated power cable 400 from the power source. Further, it generates an output for a data processor (not shown) by means of which data such as the frequency of occurrence of the signal of insulating deterioration pulses with respect to the phases of the charging current, i.e. the dominant wave are analyzed, in order to judge the degree and cause of deterioration.

When the arrangement in FIG. 4 is so modified that the zero-phase voltage from a potential grounding transformer (not shown) is applied to the input terminals of the dominant wave input circuit 602, a faint grounding can be detected.

Thus, the apparatus shown in FIG. 4 makes it possible, with a simple structure, to constantly monitor with high reliability the insulation condition of a high-tension cable, thereby preventing accidents due to deterioration in insulation.

Figures 1, 5:
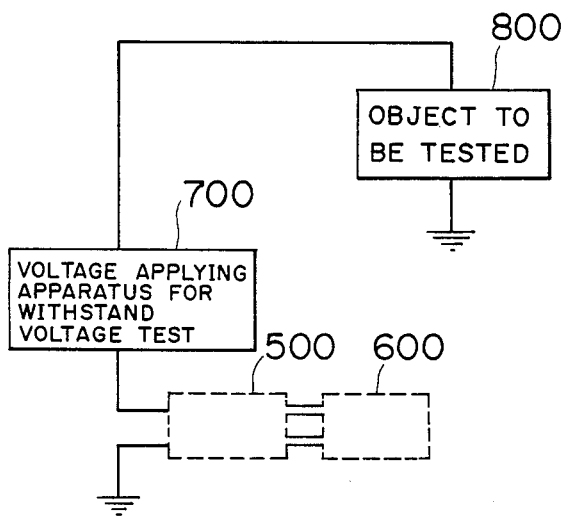
Figures 2, 5:
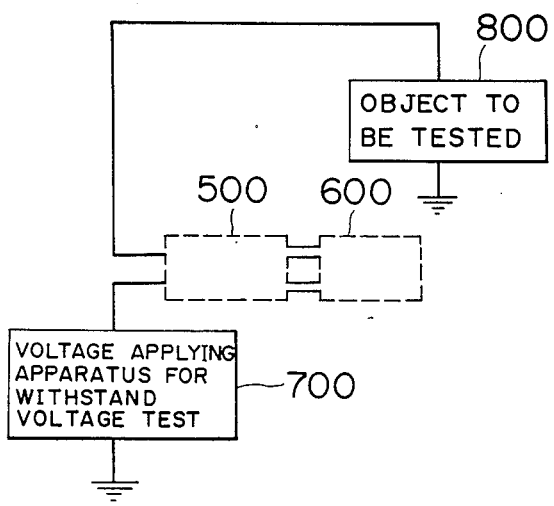

FIG. 5-1 shows the apparatus of FIG. 4 as applied to a DC high-tension test or an AC withstand voltage test. FIG. 5-2 shows an arrangement used for the same purpose. Only, it is different from the one shown in FIG. 5-1 in that the apparatus in accordance with this invention is placed on the high-tension side, thereby eliminating the influence of any leakage current in the testing apparatus. Both arrangements include a detection section 500 designed to detect any deterioration in insulation, a signal receiver 600, a voltage applying apparatus 700 for withstand voltage test, and an object 800 to be tested. By thus using the apparatus in accordance with this invention in combination with a voltage applying apparatus, it is made possible to detect any deterioration of the insulator, so that one can take such steps as stopping of the test when application of high voltage is dangerous, thereby preventing dielectric breakdown of the insulator during the withstand voltage test.

When in the cores 100 and 200 in the construction shown in FIG. 2 are made of VATROVAC-6025F manufactured by Vacuumschmelze GmbH which is a cobalt based amorphous alloy, an S/N ratio of ca. 120dB can be easily obtained (S denotes the deterioration signal level, and N the level of the signal corresponding to the sum of the charging current in the insulator and the leakage current).

Thus, an apparatus for detecting deterioration in insulation of electric equipment and cables can be realized in the form of an apparatus which is economical, compact and lightweight and which provides a high S/N ratio with a simple structure.

Said cobalt based amorphous alloy is composed of cobalt (Co), iron (Fe), silicon (Si), boron (B), molybdenum (Mo), and nickel (Ni) and can be formulated as:

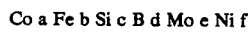

$Co_a Fe_b Si_c B_d Mo_e Ni_f$ where a to f represent the atomic percentage of the component elements. Here, a = 50 to 90, b = 1 to 10, c = 5 to 20, d = 0 to 20, e = 0 to 20, and f = 1 to 5, the sum of a through f being 100.

The cores 100 and 200 consist of toroidal cores with, for example, a ring-like configuration, each formed by winding a number of times a ribbon made of a cobalt based amorphous alloy. After being formed as rings, these toroidal cores of a cobalt based amorphous alloy are provided with a desired magnetic permeability by a heat treatment under a temperature of 150 to 450 degrees C for 5 to 180 minutes. It is desirable that the heat treatment should be effected in a DC or AC magnetic field so that a uniform performance may be obtained. A more stable performance will be attained by conducting the heat treatment in a nitrogen atmosphere.

As described above, the first type of apparatus in accordance with this invention makes it possible to detect with high sensitivity any deterioration of the insulators of electric equipment and cables which are in service. When applied to an apparatus for continuously monitoring insulation condition, this first type of apparatus in accordance with this invention helps to prevent accidents arising from dielectric breakdown. Further, it can be realized in the form of an economical, compact and lightweight apparatus.

A method of and an apparatus for ascertaining the power line whose insulating performance has deteriorated when a power supply system with two or more power lines is suffering from a degraded insulation by detecting a progressive wave generated by the corona discharge or the partial discharge in the section concerned will now be described.

When an insulation defect occurs in a power line a corona discharge or a partial discharge is generated in the section concerned.

This discharge causes a progressive wave to be generated, which travels in both directions of a line from the section concerned. Accordingly, it is possible to ascertain the power line which has deteriorated in insulation out of a plurality of lines forming a power supply system by detecting this progressive wave.

Further, it is possible to locate the point at which the abnormality has occurred by sensing the travel direction of said progressive wave. This is made possible by comparing the phase of the progressive wave at a specific (reference) point in a common bus which is an electrical reference point with the phase thereof in each power supply line branching off from the common bus. In other words, the point at which the progressive wave has generated (deteriorated point) can be located by measuring the travel direction of the progressive wave at a plurality of positions.

Figure 6:
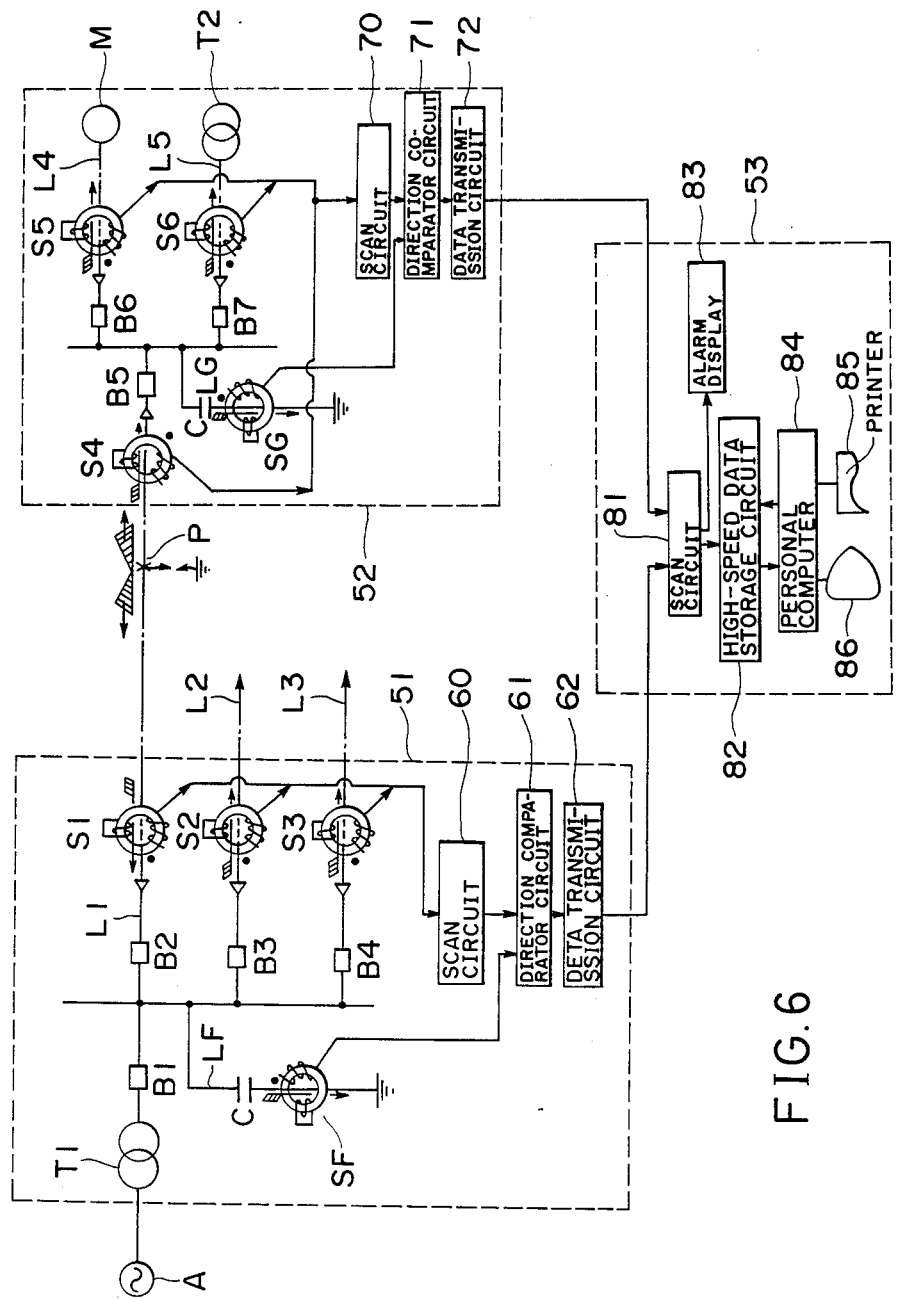
FIG. 6 is a block diagram showing the overall arrangement in accordance with a second embodiment of this invention.

This method will now be explained with reference to FIG. 6. First, the progressive wave generated the deterioration in insulation at the point P travels through all the sensors. Assuming that the direction of the progressive wave travelling through the sensor SF in the vicinity of the capacitor C provided in the first common bus LF is to be regarded as the reference, it will be appreciated that the travel direction of the progressive wave detected by the sensor S1 of the cable L1 whose insulation has deteriorated is opposed to the reference, i.e., the travel direction of the progressive wave detected by the sensors S of the other cables L.

Similarly, assuming that the travel direction of the progressive wave travelling through the sensor SG placed between the second common bus LG and the ground GND is to be regarded as the reference, the travel direction of the progressive wave detected by the sensor S4 of the cable L1 whose insulation has deteriorated is opposed to the direction of the progressive wave detected by the sensors S provided in the other cables L.

Consequently, it is possible to locate the place where the deterioration in insulation has originated by measuring in a measurement section 53 the signal detected by the sensors S.

As the sensor for detecting the progressive wave, one described below may be employed:

This sensor (signal discriminator) is composed of a first winding M1 with short-circuited ends and a second winding M2 for detecting signals, said first and second windings M1 and M2 being wound on an annular core K which has an approximately linear BH characteristic, i.e., whose magnetomotive force and magnetic flux density are roughly proportional to each other, and whose magnetic permeability is approximately constant over the entire frequency range from low to high regions.

Said annular core K may be, for example, made of an amorphous metal containing cobalt as the main component.

Figure 8A:
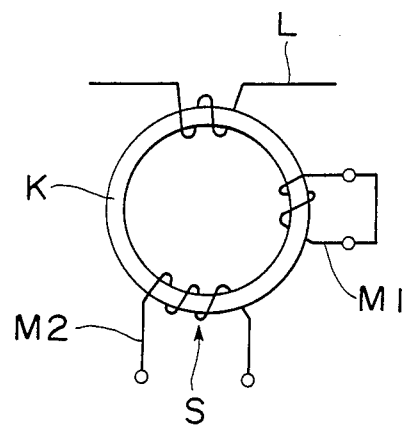
FIGS. 8A and 8B are front views illustrating the sensor.

As shown in FIG. 8A, the cable L, the line from which signals are to be detected, is wound on the annular core K. A low frequency current and a high frequency current flow through the cable L, thereby generating a magnetomotive force in the core K.

The first and second windings M1 and M2 act as a secondary coil with respect to the cable L (primary coil), so that an electromotive force is generated in the first winding M1. Since the ends of the first winding M1 are short-circuited, a current which cancels the magnetic flux change in the annular core K flows through this first winding M1. Here, the annular core K has a high magnetic permeability which is approximately constant over the entire frequency range from low to high regions. Further, its residual magnetism and coercive force are both small, and it presents an approximately linear BH characteristic, i.e., its magnetomotive force and magnetic flux density are roughly proportional to each other. Accordingly, the inductive reactance of the first winding M1 is low for a low frequency and high for a high frequency.

On account of this, only the high frequency component can be obtained from the second winding M2, the low frequency component being cancelled.

Figure 8B:
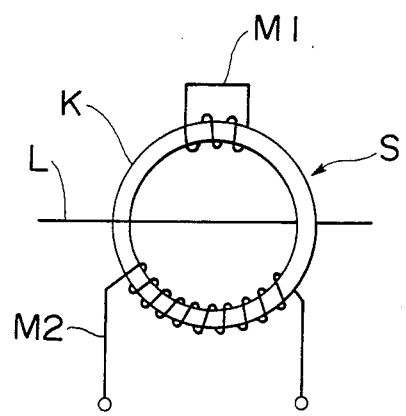

In practice, the line L from which signals are to be detected can be set merely by passing it through the core K, as shown in FIG. 8B.

Said core may be, for example, made of a cobalt based amorphous alloy which is composed of cobalt (Co), iron (Fe), silicon (Si), boron (B), molybdenum (Mo), and nickel (Ni) and which can be formulated as:

(Co) a Fe) b (Si) c (B) d (Mo) e (Ni) f where a to f represent the atomic percentage of the component elements. Here, a=50 to 90, b=1 to 10, c=5 to 20, d=0 to 20, e=0 to 20, and f=1 to 5, the sum of through f being 100.

The core K may be formed, for example, as a toroidal core made of a ribbon of a cobalt based amorphous alloy. After being formed, this toroidal core is provided with a desired magnetic permeability by a heat treatment under a temperature of 150 to 450 degrees C for 5 to 180 minutes. It is desirable that the heat treatment should be effected in a DC or AC magnetic field so that a uniform performance may be obtained. A more stable performance will be attained by conducting the heat treatment in a nitrogen atmosphere.

Although the first and second windings M1 and M2 may be wound separately, they may also share a part.

As for the material of the core K, the 6025F which is a ribbon of an amorphous alloy manufactured by Vacuumschmelze GmbH may be employed. When formed into a toroidal core, this material can provide a desired magnetic permeability.

Another embodiment of this invention will now be described with reference to FIGS. 6 through 14.

First, the applicant has verified that any deterioration in insulation of a power supply line causes a corona discharge or a partial discharge in the section concerned and that such a discharge generates a progressive wave in the power supply line.

An apparatus which utilizes said progressive wave in order to locate the section where the deterioration in insulation is generated will be described first.

In a substation 51 which is supplied with power by an AC power source A, a transformer T1 and a circuit breaker B1 are provided in the transmission line, to form a first common bus LF, which is connected to the ground GND through the intermediary of a capacitor C.

Provided in the section between the capacitor C and the ground is an annular sensor SF surrounding the line. The output signal from this sensor SF acts as the signal of the reference point provided in the common bus.

Transmission cables L1, L2 and L3 are connected to said common bus LF through the circuit breakers B2, B3 and B4, respectively. Annular sensors S1, S2 and S3 are attached to these cables in such a manner as to surround them. Said cable L1 extends to a place 52 where the power is to be consumed.

In said place 52, a sensor S4 is attached to the cable L1, which is connected to a second common bus LG through the intermediary of a circuit breaker B5.

Said second common bus LG is connected to the ground GND through the intermediary of a capacitor C. An annular sensor SG is attached to the line at the position between the capacitor C and the ground GND in such a manner as to surround the line. The output signal from this sensor SG acts as the signal at the reference point in the second common bus LG.

Power transmission cables L4 and L5 are connected to said second common bus LG through the intermediary of circuit breakers B6 and B7, respectively. Annular sensors S5 and S6 are attached to these cables L4 and L5, respectively, in such a manner as to surround them.

Said cable L4 is connected to a motor M, and said cable L5 is connected to a transformer T2.

The output signals of said sensors S1, S2 and S3 are transmitted to a scanning circuit 60 where they undergo time series division. They are then transmitted to a direction comparator circuit 61 and are compared with the signal from said sensor SF. The result of this comparison is transmitted to a data transmission circuit 62.

On the other hand, the output signals of said sensors S5 and S6 are transmitted to a scanning circuit 70 where they undergo time series division. They are then input to a direction comparator circuit 71 and are compared with the signal from said sensor SG. The result of this comparison is transmitted to a data transmission circuit 72.

Figure 12:
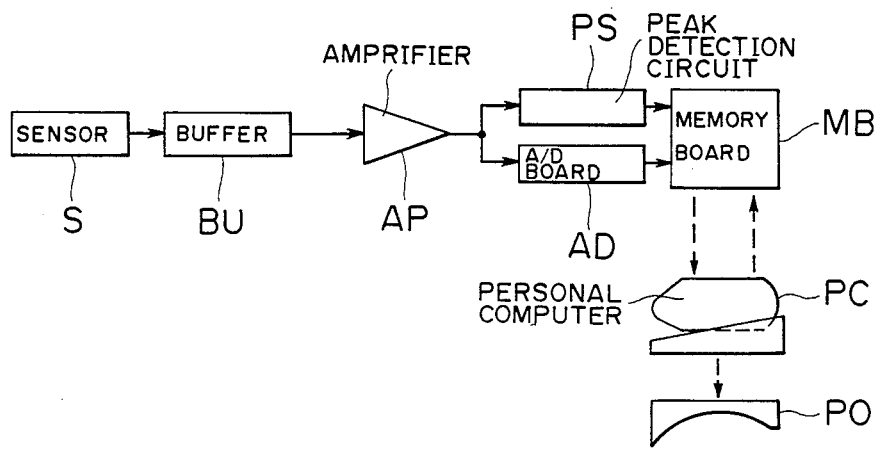
FIG. 12 is a block diagram showing the signal processing circuit.

The signals from said data transmission circuits 62 and 72 are input to a measurement section 53. They are first input to a scanning circuit 81 where they undergo time series division. They are then input to a high-speed data storage circuit 82 as well as to an alarm indication circuit 83. The high-speed data storage circuit 82 is connected to a personal computer 84 so that data can be exchanged. A CRT 86 and a printer 87 are connected to the personal computer 84 so that the examination result can be displayed. FIG. 12 shows a specific example of the hardware of said high-speed data storage circuit 82. This hardware comprises a sensor S, a buffer BU connected to the output of this sensor S, an amplifier AP adapted to amplify the signal from the buffer BU, a peak sensor PS connected to the output of the amplifier AP and adapted to detect the maximum value of the output signal, an A/D converter AD of 20MHZ connected parallel to this peak sensor PS, a memory board MB adapted to store the respective output signals from the peak sensor PS and the A/D converter AD and having a capacity of 2KB, a personal computer PC adapted to exchange signals with this memory board MB, and a printer PO as the output device.

The operational principle of said sensor S and that of the circuits will now be explained.

Figure 9:
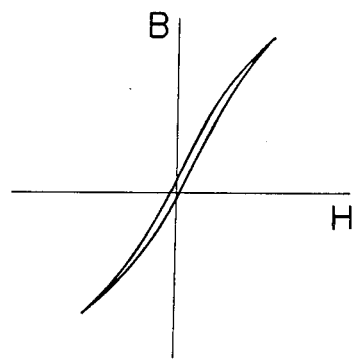
FIG. 9 is a graph showing the BH-characteristic curve of the core used in the sensor.
Figure 10:
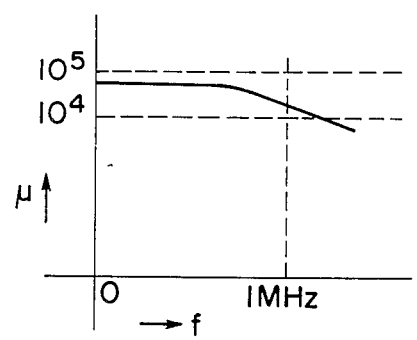
FIG. 10 is a graph showing the frequency characteristic of the core used in the sensor.

Said sensor S is composed of a core K and coils wound thereon. Said core K is made of a cobalt based amorphous metal whose magnetic permeability is approximately constant from the low frequency region to the high frequency region, as shown in FIG. 10. Its residual magnetism and coercive force are both small, and its BH characteristic is approximately linear, as shown in FIG. 9. On this core K are wound a first winding M1 with short-circuited ends and a second winding M2 with open ends as shown in FIG. 8. The core K has a width of 10 mm, an inner diameter of 150 mm and a height of 3 mm. The number of turns is three for said first winding M1 and ten for said second winding M2.

This construction enables said progressive wave generated by a corona discharge or a partial discharge to be discriminated from the frequency of the power source and the low frequency current which is a higher harmonic thereof. A corona discharge amount of 20 pC was detected in an experiment of the sensitivity of the sensor S with the above construction.

Figure 7:
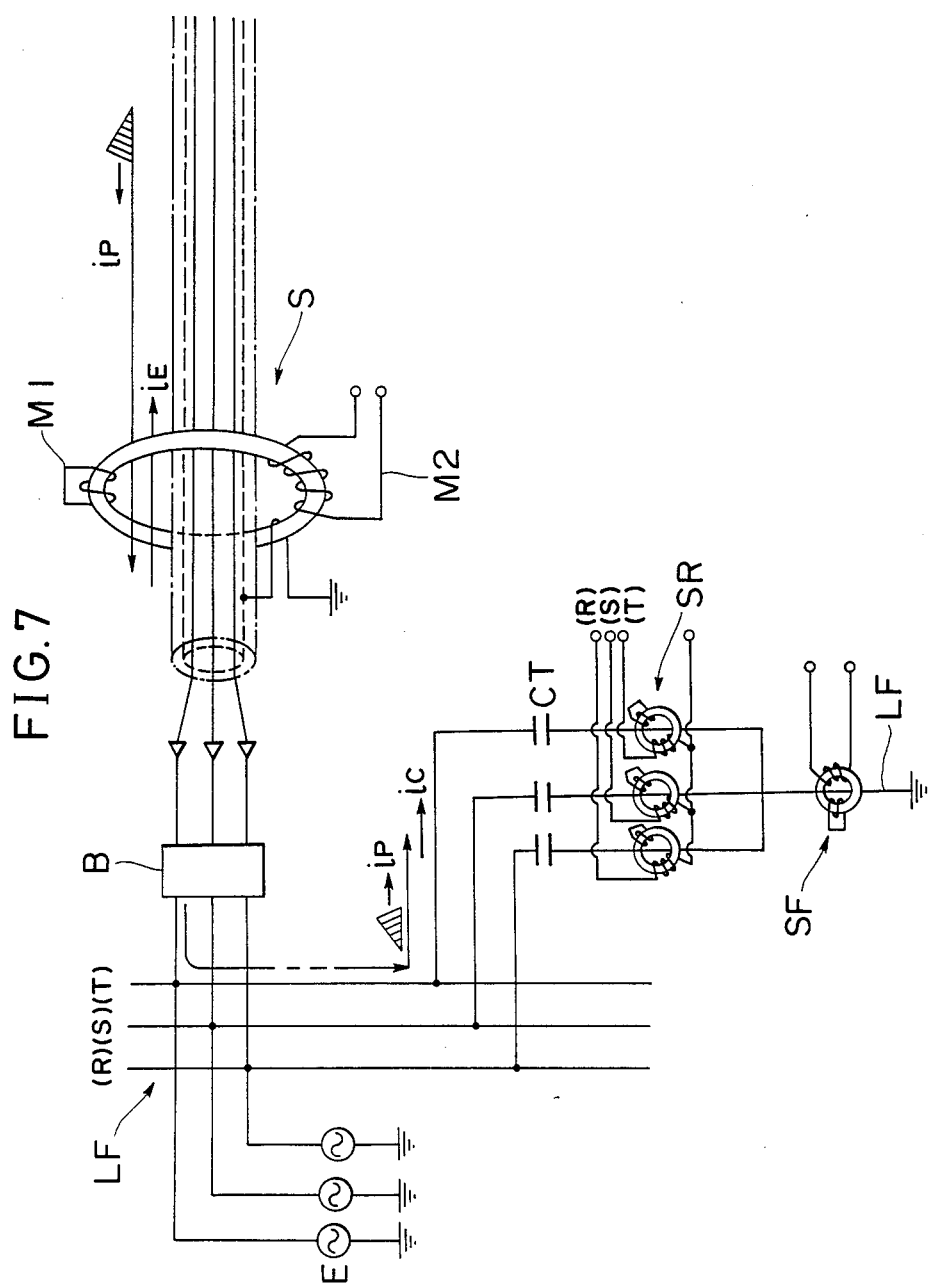
FIG. 7 is a schematic diagram illustrating the circuits in the sensor section.

FIG. 7 shows this construction as applied to a power supply line for three-phase AC current. The travel velocity V of the progressive wave may be expressed as:

$$V = [(\text{magnetic permeability} \times \text{dielectric constant})^{\frac{1}{2}}]^{-1}$$

Here, the dielectric constant of a polyethylene is four times as large as that of air, so that the propagation velocity in the transmission line is about one half of the velocity of light. Consequently V is ca. 150 m/μs. The progressive wave thus travels through the core at a very high speed, resulting in a sharp pulse magnetomotive force. A low frequency current which is power source and higher harmonic thereof and a progressive wave current due to said corona discharge or partial discharge are generated in each winding, and the inductive reactance of the first winding M1 is low to a low frequency and high to a pulse. Accordingly, the magnetic flux change due to the magnetomotive force of the low frequency current $i_E$ can be neglected almost completely, but the magnetic flux change caused by the magnetomotive force of the pulse current generated by the passing of the progressive wave remains uncancelled.

Consequently, only the signal caused by the passing of the progressive wave is obtained at the terminals of the second winding M2.

Further, it is possible to know through which phase of the capacitor CT the progressive wave travels by means of a sensor SR provided in each of the phases, thereby obtaining a discrimination signal for ascertaining the deteriorated phase. Furthermore, it is possible to obtain by means of a sensor SF provided in the common line of the capacitor CT connected to the bus LF, a signal which serves as the reference for the travel direction of the progressive wave since the progressive wave passes through the sensor in the same direction, no matter which phase or which section of the system may have deteriorated.

Although the signals from these detection coils may be transmitted on a time-series basis as in the above-described embodiment, it is also possible, if there is some allowance in the signal transmission capacity, to transmit them in parallel.

Said progressive wave presents a frequency spectrum which is similar to that of a discharge noise and possesses energy over a wide frequency range. However, it can sometimes present a frequency distribution which is peculiar to the corona discharge caused by deterioration in insulation and improves its S/N ratio against external noises by limiting the unnecessary bands, so that a band pass filter may be efficiently employed for restricting the band.

In an experiment using a band pass filter, a satisfactory result was obtained when the frequency range to be sensed was set to a range of 20kHz to 200MHz, more preferably, 300kHz to 50MHz, and still more preferably, 300kHz to 5MHz. The actual passing frequency has to be adapted to the individual cases by means of a spectrum analyzer, etc. As for this filter, a tandem-compound filter of the multipoint tuning type may naturally be employed, instead of the above-described single tuning type.

Figure 11:
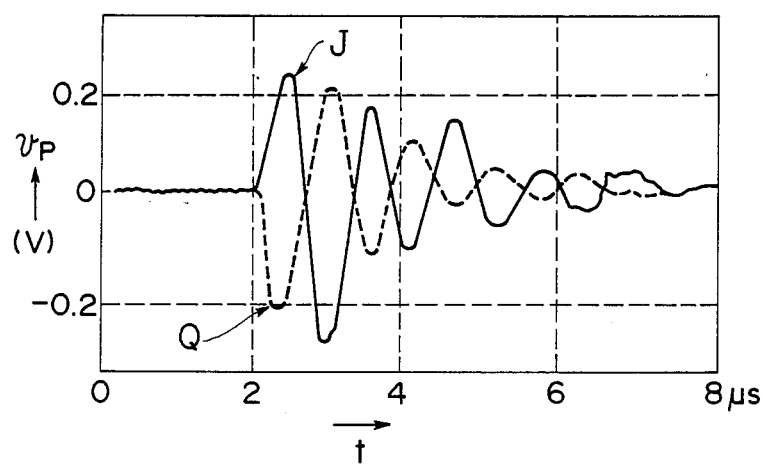
FIG. 11 is a graph showing a detection result of the progrssive wave.

Next, the result of an experiment in which the progressive wave generated by the corona discharge due to deterioration of the insulator of a cable was detected using the circuit shown in FIG. 6 employing the sensor of FIG. 8, will be described with reference to FIG. 11. In the graph, J denotes the signal characteristic curve of the sensor S1 provided in the cable, and Q the signal characteristic curve of the sensor SF provided in the bus. If there is some insulation defect in the cable, the progressive wave travels in both directions in the cable. Since the directions of the progressive wave currents passing through the sensors SF and S1 are opposed to each other, the phases of J and Q are approximately reverse to each other. This indicates the existence of the progressive wave, i.e. the existence of the defect in the cable clearly.

The actually measured waveform will now be described with reference to FIGS. 13 and 14.

Figure 13:
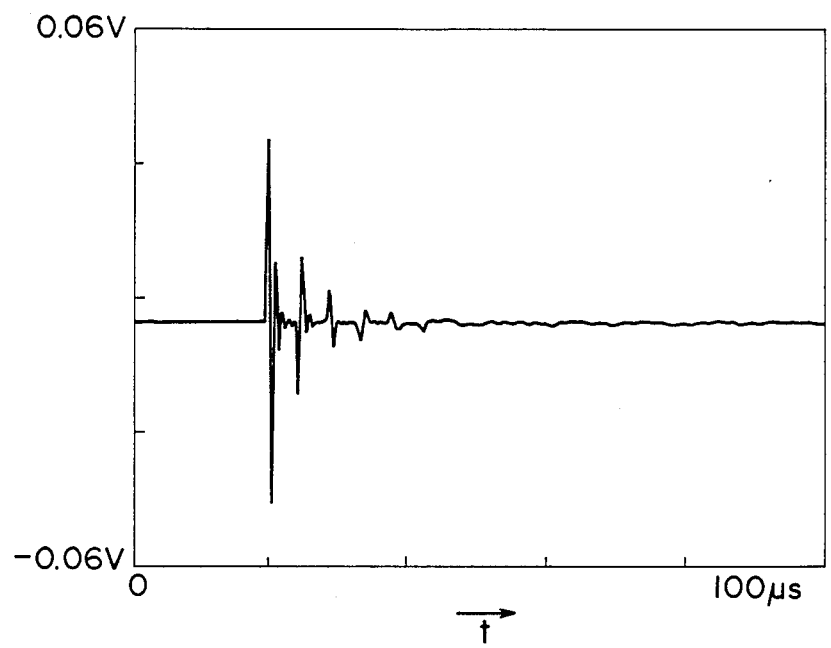
FIGS. 13 and 14 are graphs showing a measurement result.
Figure 14:
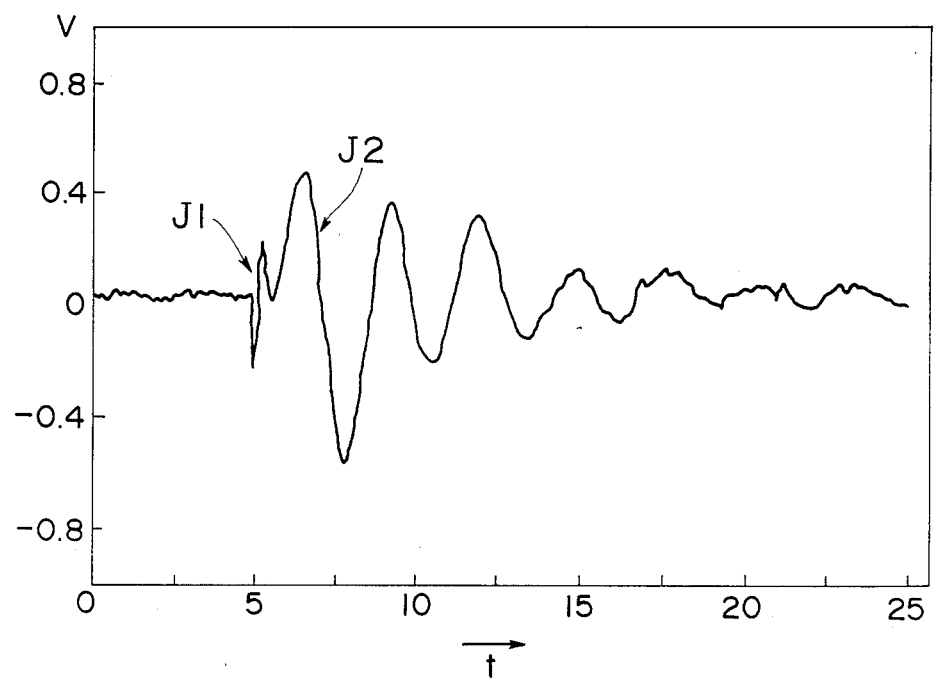

FIG. 13 shows the waveform when the progressive wave is generated at a place distant from the point of measurement point. A progressive wave reflected at the terminal load such as a motor appears periodically by decreasing its strength.

The pulse due to the corona discharge can be observed as it is. However, it is generated within a period of very short duration, so that it is sometimes difficult to catch. In view of this, a resonance circuit may be provided in the pulse detection circuit so that the pulse may be caught with ease. FIG. 14 shows the waveform when such a circuit is employed. In this figure, J1 denotes the pulse due to the corona discharge. After that, the pulse excites the resonance circuit and presents an attenuated waveform J2 with a specific frequency.

The size, configuration and material of the core K are not to be restricted to those of the above-described embodiments. They can naturally be modified according to the detecting conditions.

Thus, the present invention makes it possible to constantly monitor the insulating condition of electrical equipment and cables in a hot-line condition.

Further, if any abnormality has occurred in insulation of electrical equipment or cables, the position thereof can be located.

Accordingly, any insulating defect can be detected before it becomes serious, thereby making it possible to prevent accidents arising from poor insulation.

What is claimed is:

1. An apparatus for detecting deterioration in insulation of electrical equipment and cables, comprising a first coil 1 composed of two primary windings 11, 12 and a secondary winding 13 wound on a core whose magnetomotive force and magnetic flux density are approximately proportional to each other, said primary windings 11 and 12 being wound with the same number of turns and in the same direction, a second coil 2 composed of a primary winding 21 and a secondary winding 22 wound on a core whose magnetomotive force and magnetic flux density are approximately proportional to each other, and an impedance circuit 3, the terminals 21-a and 21-b of the primary winding 21 in the second coil 2 being respectively connected to the winding end terminal 11-b of the primary winding 11 and the winding end terminal 12-b of the primary winding 12 in the first coil 1, said impedance circuit 3 being connected to the winding end terminal 11-b of the primary winding 11 and the winding start terminal 12-a of the primary winding 12 in the first coil 1, a signal indicative of deterioration in insulation of electrical equipment or cables being obtained at the terminals 13-a and 13-b of the secondary winding 13 in the first coil 1 or at the terminals 22-a and 22-b of the secondary winding 22 in the second coil 2 when the winding start terminal 11a of the primary winding 11 and the winding start terminal 12-a of the primary winding 12 in the first coil 1 are connected to the shielding case of said electrical equipment or the shield of said cable and the ground, respectively.

2. An apparatus as claimed in claim 1, wherein the cores forming said coils 1 and 2 are made of an amorphous metal containing cobalt as the main component.

3. A method of assessing the insulation condition of a power supply system composed of two or more power supply lines branching off from a common bus, said method comprising; detecting, when insulation performance of one of said power supply lines has deteriorated, the direction of a progressive wave generated, in said power supply system, by a corona discharge of a partial discharge occurring at a defective portion of said open of said power supply lines, by comparing the phase of said progressive wave at a reference point provided in said common bus with the phase of said progressive wave in each of said power supply lines branching off from said common bus; and locating said one of said power supply lines whose insulation performance has deteriorated and the position of deterioration of said insulation performance from said detected direction of said progressive wave.

4. A method as claimed in claim 3 wherein said progressive wave in each of said power supply lines branching off from said common bus are input on a time-division basis to an arithmetic unit to undergo an operation processing.--.

5. A method as claimed in claim 3 wherein phase signals of said progressive wave in each of said power supply lines branching off from said common bus are input in parallel to an arithmetic unit to undergo an operation processing.

6. A method as claimed in claim 3, wherein said progressive wave, due to said corona discharge or said partial discharge, generated in a section of one of said power supply lines where deterioration in insulation has occurred, is detected by means of respective sensors attached to an electrical reference point and to each of said power supply lines, each of said sensors being composed of a first winding with short-circuited ends and a second winding, both windings wound on an annular core having an approximately linear BH characteristic and a magnetic permeability which is approximately constant from a low frequency region to a high frequency region, each of said sensors providing a measurement signal from said second winding.

7. An apparatus for assessing the insulating condition of a power supply system composed of two or more power supply lines branching off from a common bus, comprising a plurality of sensors adapted to detect a progressive wave, generated by a corona discharge or a partial discharge in a section of a power line where deterioration in insulation has occurred, each of said plurality of sensors being operatively associated with a respective power supply line or said common bus and generating an output signal upon detection of said progressive wave, and a measurement section where said output signals from said sensors are input and each of said signals from a sensor associated with a power supply line is compared with said signal from said sensor associated with said common bus, each of said sensors being composed of a first winding with short-circuited ends and a second winding, both windings wound on an annular core having an approximately linear BH characteristic and a magnetic permeability which is approximately constant from a low frequency region to a high frequency region.

8. An apparatus as claimed in claim 7, wherein said core is made of an amorphous metal alloy containing cobalt as the main component.

* * * * *

UNITED STATES PATENT AND TRADEMARK OFFICE
CERTIFICATE OF CORRECTION

PATENT NO. : 4,929,903

DATED : May 29, 1990

INVENTOR(S) : AKIRA SAIGO, ET AL.

It is certified that error appears in the above-identified patent and that said Letters Patent is hereby corrected as shown below:

Claim 3, line 7, delete "of", insert --or--;

line 9, delete "open", insert --one--.

Claim 4, line 1, insert --phase signals of--.

Signed and Sealed this

Eleventh Day of June, 1991

Attest:

HARRY F. MANBECK, JR.

Attesting Officer

Commissioner of Patents and Trademarks